United States Patent
Naviasky et al.

(10) Patent No.: US 8,710,929 B1
(45) Date of Patent: Apr. 29, 2014

(54) SYSTEM AND METHOD FOR COMBINED I/Q GENERATION AND SELECTIVE PHASE INTERPOLATION

(75) Inventors: Eric Naviasky, Ellicott City, MD (US); Chris Moscone, Cary, NC (US); Rajagopal Vijayaraghavan, Cary, NC (US); Benjamin Louis Heilmann, Raleigh, NC (US)

(73) Assignee: Cadence Design Systems, Inc., San Jose, CA (US)

( * ) Notice: Subject to any disclaimer, the term of this patent is extended or adjusted under 35 U.S.C. 154(b) by 109 days.

(21) Appl. No.: 13/471,945

(22) Filed: May 15, 2012

(51) Int. Cl.
*H03K 3/03* (2006.01)

(52) U.S. Cl.
USPC ............. 331/57; 331/182; 331/183; 331/185; 331/186

(58) Field of Classification Search
USPC ............................. 331/57, 182, 183, 185, 186
See application file for complete search history.

(56) References Cited

U.S. PATENT DOCUMENTS

| | | | |
|---|---|---|---|
| 5,021,749 A | | 6/1991 | Kasai et al. |
| 5,898,328 A | | 4/1999 | Shoji |
| 5,955,929 A | * | 9/1999 | Moon et al. .................. 331/57 |
| 6,222,423 B1 | * | 4/2001 | Sudjian ......................... 331/57 |
| 6,462,623 B1 | * | 10/2002 | Horan et al. .................. 331/17 |
| 2003/0215039 A1 | | 11/2003 | Block et al. |
| 2006/0256911 A1 | | 11/2006 | Rosik et al. |
| 2007/0030046 A1 | | 2/2007 | Pai et al. |
| 2007/0273415 A1 | | 11/2007 | Kimura et al. |
| 2009/0108892 A1 | | 4/2009 | Chen et al. |
| 2010/0134170 A1 | * | 6/2010 | Wang ........................... 327/288 |

* cited by examiner

*Primary Examiner* — Joseph Chang
*Assistant Examiner* — Jeffrey Shin
(74) *Attorney, Agent, or Firm* — Rosenberg, Klein & Lee

(57) ABSTRACT

A system and method are provided for combined generation of I and Q signal references according to a periodic input signal and selective phase interpolation of an output signal with reference thereto. A ring oscillator portion generates an oscillator signal, and includes a plurality of delay stages interconnected in cascade to collectively execute an odd number of signal state inversions within a closed loop. The delay stages establish at respective nodes defined therebetween correspondingly delayed oscillator signal versions, successively shifted in phase by a predetermined phase difference. A signal injection portion selectively applies to at least one node of the ring oscillator portion a current bias according to the periodic input signal, and selectively adjusts each current bias in amplitude. The oscillator signal is thereby frequency locked to the periodic input signal, defining I/Q references with respect to the delayed oscillator signal version established at the current biased node.

21 Claims, 12 Drawing Sheets

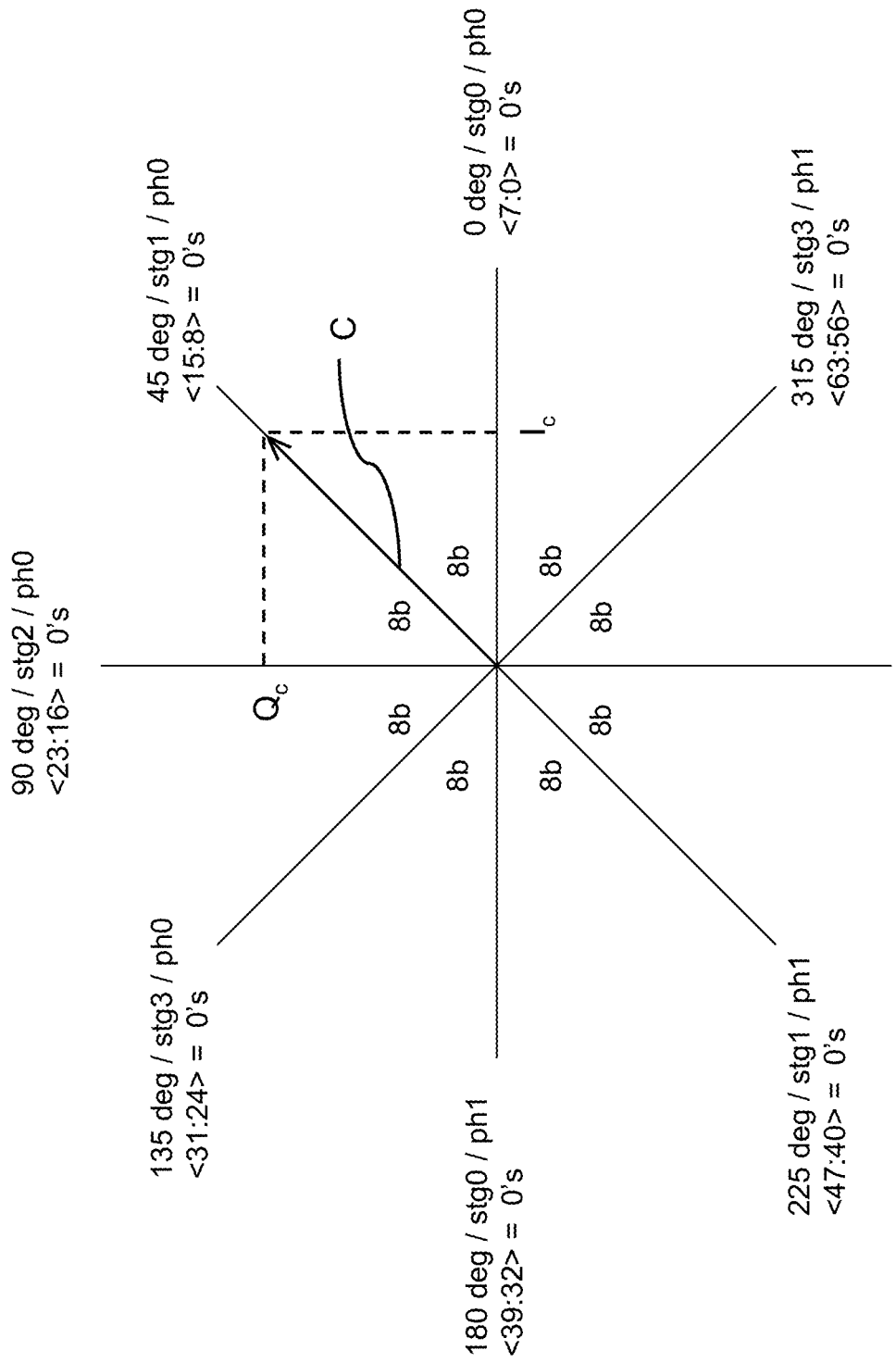

SYSTEM AND METHOD FOR COMBINED I/Q GENERATION AND SELECTIVE PHASE INTERPOLATION

BACKGROUND OF THE INVENTION

The subject system and method are generally directed to the combined generation of In-phase (I) and Quadrature (Q) reference signals for a periodic input signal, and of selectively phase interpolated signals based on the same. More specifically, the subject system and method are directed to the injection locked generation of such signals in phase adjustable manner.

Sinusoidal and other such periodic signals find wide use for clocking and other purposes in a vast range of applications. A sinusoidal signal of certain frequency may be represented in a number of ways. For instance, it may be represented in polar form, with its value at any instant being defined as a phase vector, or phasor, having certain amplitude and phase offset angle values. A rotation of the phase vector one (360°) revolution about a point of origin then delineates the full range of instantaneous values described during one cycle of the sinusoid signal.

When the periodic signal's polar representation is translated onto a two-dimensional Cartesian coordinate system, the same phasor may be defined in terms of horizontal X and vertical Y coordinates with respect to a center point of origin. If the horizontal X-axis is defined as the In-phase reference (I reference) and the vertical Y axis is redefined as the Quadrature (Q) reference, each phasor may then be represented as the vector sum of respective values projected onto the I and Q references. That is, a given phasor may be uniquely represented in Cartesian coordinate form by its I and Q component values.

Thus, any phase interpolated version of a given periodic signal (or the instantaneous values of its phase vector at any phase angle position about the origin in the polar representation) may be represented in terms of the signal's I and Q references. By definition, the I and Q reference signals are versions of the same periodic signal, but with the Q reference signal lagging the I reference signal in phase by 90° (or by a quarter cycle).

Such representation of periodic signals in terms of their I and Q references is helpful in a wide range of wireless communication and other systems, particularly where data signals are modulated for reliable transmission and processing. In typical applications, a dedicated I/Q generator is utilized to formulate the I and Q references for a given periodic signal.

A separate phase interpolator circuit then formulates different phase offset versions of the periodic signal for further use. In digital applications, such as within serializer/deserializer (SerDes) systems, a periodic signal in the form of a digital clock (a train of substantially square pulses) is fed into an I/Q generator circuit which produces I Q, Ī, and $\overline{Q}$ reference signals (which represent the clock at 0°, 90°, 180°, and 270° phase offsets). These signals then serve as reference inputs to the phase interpolator circuit, by which a clock of any arbitrary phase offset may be produced.

Unfortunately, generating I and Q references (and its Ī and $\overline{Q}$ counterparts) using systems and techniques heretofore known is not a trivial matter. One widely used technique takes a clock signal of twice the desired frequency and generates I and Q references by dividing (by a factor of 2) at the rising and falling edges of each clock pulse. If the original clock signal were of 50% duty cycle, the resulting waveforms would define a frequency half that of the original clock frequency and exhibit a mutual offset in phase of one quarter cycle, or 90°. The leading waveform would define the I reference, while the other waveform would define the Q reference.

An obvious disadvantage of this approach to I/Q generation is the need for a base clock that operates twice as fast as the generated I/Q references. In applications where such a base clock is not readily available, other approaches have been taken for I/Q generation. For example, polyphase filters and various timing delay measures have been used to construct I and Q signal references. Not only are these approaches inherently cumbersome, requiring numerous extraneous components and measures, they typically generate just one output, either the I reference or Q reference, but not both concurrently. These approaches necessitate power- and area-intensive filters, delay lines, control loops, and the like.

There is therefore a need for a system and method by which I and Q references may be more simply and conveniently generated. There is a need for such system and method, in certain applications, by which discrete and adjustable clock phasing is generated for interpolating signals between the resulting I and Q references. There is also a need for such system and method whereby selectively phased interpolated signals may be conveniently generated with respect to the I and Q signal references.

SUMMARY OF THE INVENTION

It is an object of the present invention to provide a system and method by which I and Q references may be simply and conveniently generated.

It is another object of the present invention to provide a system and method whereby selectively phased interpolated signals may be conveniently generated with respect to the I and Q signal references.

These and other objects are attained in a system for combined generation of I and Q signal references according to a periodic input signal and selective phase interpolation of an output signal with reference thereto. The system comprises a ring oscillator portion generating an oscillator signal, and which includes a plurality of delay stages interconnected in cascade to collectively execute an odd number of signal state inversions within a closed loop. The delay stages are configured to establish at respective nodes defined therebetween corresponding delayed versions of the oscillator signal successively shifted in phase by a predetermined phase difference. The system also comprises a signal injection portion coupled to the ring oscillator portion selectively applying to at least one node a current bias according to the periodic input signal. The signal injection portion selectively adjusts each current bias in amplitude, and thereby locks the oscillator signal to the periodic input signal in frequency and defines the I and Q references thereof with respect to the delayed version of the oscillator signal thereafter established at the current biased node.

In certain embodiments, a system is provided for combined generation of I and Q signal references injection locked to a periodic injection signal and adjustable phase interpolation of an output signal with reference thereto. The system comprises a ring oscillator portion generating an oscillator clock signal, which includes a plurality of delay stages interconnected in cascade to collectively execute an odd number of signal state inversions within a closed loop. The delay stages are configured to establish at respective nodes defined therebetween corresponding delayed versions of the oscillator clock signal successively shifted in phase by a predetermined phase difference. The system in these embodiments further comprises a signal injection portion coupled to the ring oscillator portion selectively applying the periodic injection signal to at least one of the nodes for locking the oscillator signal thereto in frequency. The signal injection portion selectively varies a current amplitude of the periodic injection signal. The signal injection portion is selectively actuated in single and split injection modes, in the single injection mode applying the periodic injection signal exclusively to a selected one of said nodes, such that the delayed oscillator signal version thereafter established at the selected node forms the I reference. In the split injection mode, the signal injection portion applies the periodic injection signal concurrently to first and second ones of the nodes, with the periodic injection signal being applied to the first node at a first current amplitude and to the second node at a second current amplitude. The I reference is then offset in phase between the delayed oscillator signal versions established at the first and second nodes in proportional relation to a ratio of the first and second current amplitudes.

In certain other embodiments, a method is provided for generating I and Q signal references according to a periodic injection signal and selectively phase interpolating an output signal with reference thereto. The method comprises establishing a ring oscillator portion to generate an oscillator signal, where the ring oscillator portion includes a plurality of delay stages interconnected in cascade to collectively execute an odd number of signal state inversions within a closed loop. Correspondingly delayed versions of the oscillator signal successively shifted in phase by a predetermined phase difference are generated at respective nodes defined respectively between consecutive delay stages. The periodic injection signal is selectively applied to at least one of the nodes for locking the oscillator signal thereto in frequency. The periodic injection signal is selectively varied in current amplitude. The periodic injection signal is selectively applied in single or split injection modes to selectively position the I reference of the periodic injection signal with respect to a selected one of the nodes. In the single injection mode, the periodic injection signal is applied exclusively to the selected one of the nodes, such that the delayed oscillator signal version thereafter established at the selected node forms the I reference. In split injection mode, the periodic injection signal is applied concurrently to selected first and second ones of the nodes, with the periodic injection signal being applied to the first node at a first current amplitude and to the second node at a second current amplitude. The I reference is then offset in phase between the delayed oscillator signal versions established at the first and second nodes in comparative relation to a ratio of the first and second current amplitudes.

BRIEF DESCRIPTION OF THE DRAWINGS

FIG. 1 is a schematic diagram generally illustrating an example of a phasor diagram, with a phasor represented in terms of I and Q references;

FIGS. 3-1 to 3-4, collectively referred to herein as "FIG. 3," together show a simplified schematic diagram illustrating the interconnection of certain portions of a system formed in accordance with another exemplary embodiment of the present invention;

DESCRIPTION OF THE PREFERRED EMBODIMENTS

Generally, a system and method formed in accordance with certain embodiments of the present invention provide for the concurrent generation of I and Q references for a given periodic input signal by injection locking a ring oscillator signal thereto. Further, the system and method provide for the selective adjustment of at least the I reference in relative phase position to accommodate phase interpolation based thereon. The corresponding Q, $\bar{I}$, $\bar{Q}$ references, as well as any other phase references of interest, follow from the selectively adjusted I reference.

Figure 2A:
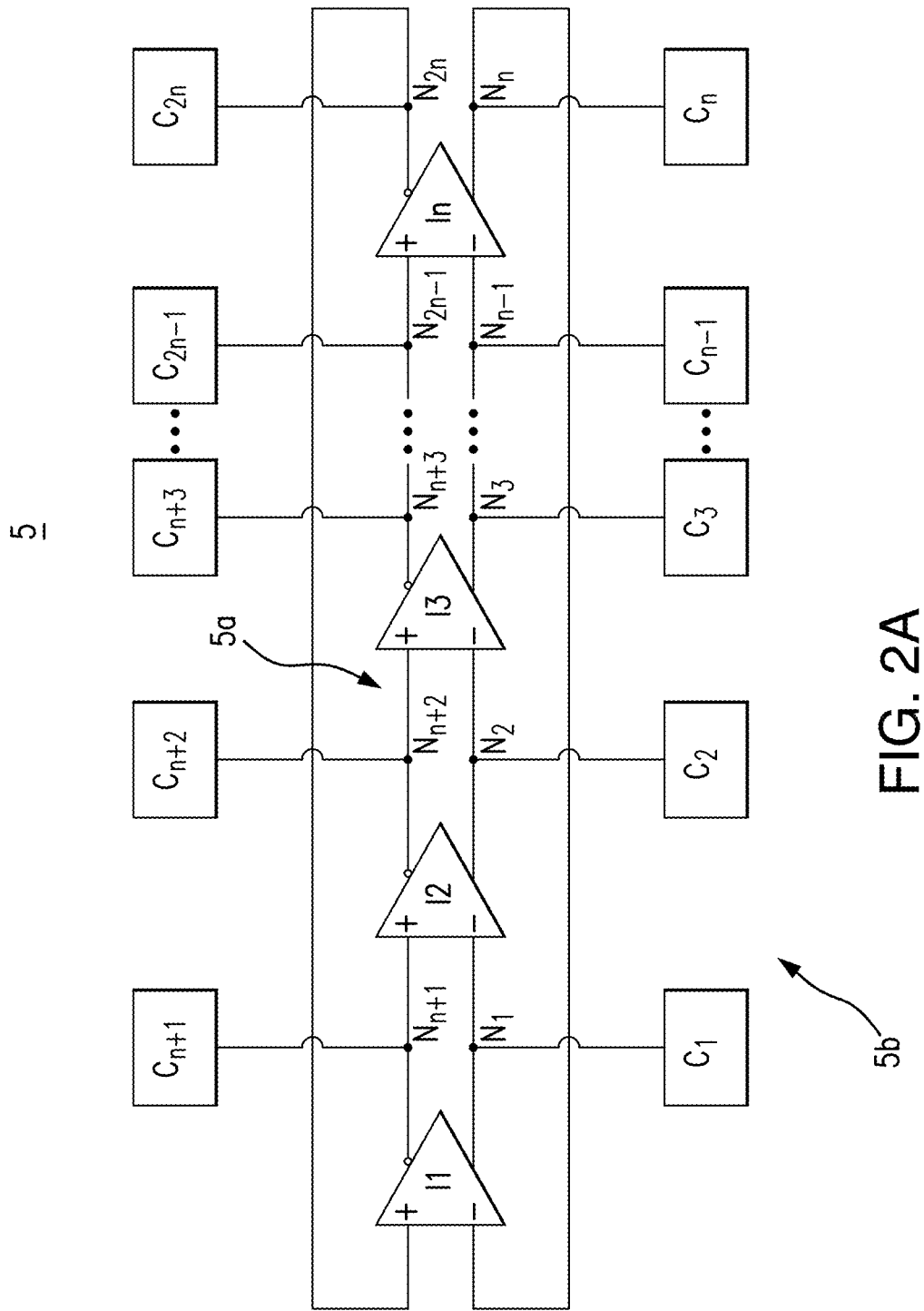
FIG. 2A is a simplified block diagram generally illustrating the interconnection of certain portions of a system formed in accordance with one exemplary embodiment of the present invention, for the case where a ring oscillator portion includes an odd number of delay stages.
Figure 2B:
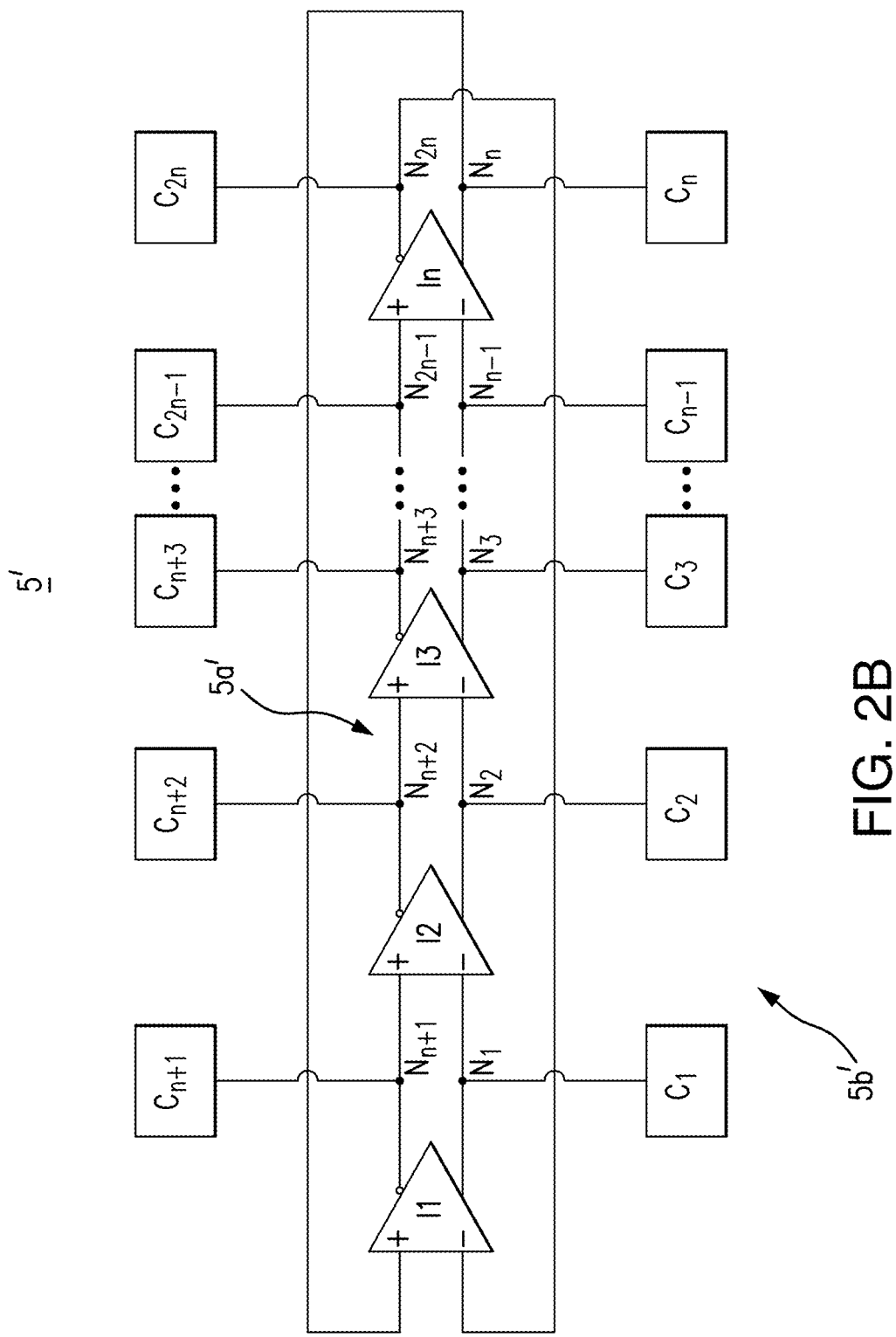
FIG. 2B is a simplified block diagram generally illustrating the interconnection of certain portions of a system formed in accordance with one exemplary embodiment of the present invention, for the case where a ring oscillator portion includes an even number of delay stages.

Referring for illustrative purposes to the highly simplified block diagram of FIG. 2A, a system 5 formed in accordance with one exemplary embodiment of the present invention generally includes a ring oscillator portion 5a and a signal injection portion 5b. Portion 5a is suitably formed with much of the features of a ring oscillator circuit known in the art, which incorporates an odd number of state inversions in a closed loop of cascaded gates. In system 5, the ring oscillator portion 5a is formed with an odd number of cascaded delay stages I1-In. Alternatively, the ring oscillator portion may be formed with an even number of stages, so long as they collectively define an odd number of inverting stages, as shown in FIG. 2B (portion 5a' in system 5'). The complementary outputs of the last delay stage In in that case are flipped, or crossed, when fed back to the input terminals of the first inverting stage I1. The systems 5 and 5' of FIGS. 2A-2B are otherwise identical, and for brevity and clarity reference is made just to system 5 in further description of the features shared by both systems.

The signal injection portion 5b includes a plurality of selectively varied current sources $C_1$-$C_{2n}$ each tied to a corresponding interconnection node $N_1$-$N_{2n}$ defined between consecutive delay stages. System 5 in this exemplary embodiment is configured for differential signal applications, where the periodic signals in question include complementary signal components. Accordingly, each of the inverting delay stages I1-In includes complementary input and output terminals, with consecutive delay stages interconnected at complementary node pairs (such as $N_1$ and $N_{n+1}$, $N_2$, $N_{n+2}$, . . . , $N_n$ and $N_{2n}$). In alternate embodiments for signal ended signal applications, each delay stage may be configured with single ended input and output terminals, with consecutive stages being interconnected at a single node.

As one skilled in the art will recognize, a ring oscillator circuit includes an odd number of inverting stages, such that when sufficiently energized, it spontaneously oscillates to establish an oscillator signal having a certain characteristic oscillation frequency. The inverting stages include active devices which when applied with supply power transition to their conductive states. The first of the inverting stages to activate in this manner causes the next inverting stage to switch states. This in turn causes the next inverting stage to switch, and so on until the switching of states continues around the loop formed by the last inverting stage's output being fed back to the input of the first inverting stage.

A characteristic oscillator signal is thus generated in the ring oscillator portion 5a of system 5. Each inverting delay stage I1-In (which includes an inverting gate) contributes a finite delay, such that a time-delayed, or phase offset, version of the oscillator signal is established at each node $N_1$-$N_{2n}$ of the ring oscillator portion 5a. Since the oscillation period depends on the total delay incurred in traversing the delay stages I1-In, incorporating delay stages I1-In of substantially identical structure and configuration makes for a consistent predetermined phase shift as the oscillator signal traverses each inverting delay stage. The number of delay stages n determines the amount of phase shift due to each stage. The oscillator signal undergoes a half cycle (0°-180°) total phase shift as it effectively 'travels' through the intervening delay stages in the first half of the ring oscillator portion's loop from node $N_1$ to node $N_n$. Similarly, the oscillator signal undergoes the remaining half cycle of phase shift (180°-360°) as it effectively 'travels' from node $N_{n+1}$ to node $N_{2n}$ of the oscillator ring portion's other half loop. Thus, each half cycle is divided by n stage-to-stage phase shifts, or by a phase shift of 180°/n between consecutive nodes $N_1$ and $N_2$, $N_2$ and $N_3$, ..., $N_{n-1}$ and $N_n$. The same would occur on the complementary side of the oscillator loop between consecutive nodes $N_{n+1}$ and $N_{n+2}$, $N_{n+2}$ and $N_{n+3}$, ..., $N_{2n-1}$ and $N_{n+2}$ and $N_{n+3}$ ..., $N_{2n-1}$ and $N_{2n}$.

Successively phase shifted versions of the original oscillator signal would be established at the nodes $N_1$-$N_{2n}$ in the oscillator loop portion 5a, with the signal versions at consecutive nodes being mutually offset in phase by 180°/n. Where four substantially identical delay stages I1-I4 are employed, for example, with the complementary outputs of delay stage I4 crossed as in FIG. 2B when fed back to the first delay stage I1, each delay stage would contribute a predetermined phase difference of 45°. Different versions of the oscillator signal established at nodes $N_1$-$N_8$ would then be successively offset in phase by 45° (which is 180° divided by 4 in the example of a 4-stage ring oscillator portion, as disclosed herein).

The signal injection portion 5b of system 5 is actuated in controlled manner to inject a predetermined periodic injection signal at one or more of the nodes $N_1$-$N_{2n}$. This effectively 'pulls' the oscillator signal to lock in both frequency and phase with the periodic injection signal, thereby injection locking the oscillator signal generated in the ring oscillator portion 5a to the periodic injection signal. That is, when an oscillator operating at a certain frequency is disturbed by a second oscillator operating at a different but very close frequency, their coupling effects yield a locking of the first oscillator to the second oscillator. If the frequencies are sufficiently close and the coupling sufficiently strong, such injection locking will consistently occur in much the manner that the vibrating strings of two instruments will eventually synchronize in vibration frequency if they are similarly tuned and drawn close enough together.

The current sources $C_1$-$C_{2n}$ of the signal injection portion 5b are suitably controlled in the first instance to apply a periodic injection signal at one or more selected node $N_1$-$N_{2n}$. If the frequency of this periodic injection signal is close enough to the frequency of the oscillator signal generated in the ring oscillator portion 5a and strong enough in current amplitude, the oscillator signal will injection lock in frequency to the periodic injection signal. The versions of the injection locked oscillator signal thereafter established at the other nodes by the ring oscillation of portion 5a will be at the periodic injection signal frequency but offset in phase according to their node locations relative to the point(s) of injection.

According to certain aspects of the exemplary embodiment disclosed, if the signal injection portion 5b causes the periodic injection signal to be injected exclusively at one select node, for instance node $N_1$, the injection locked version of the oscillator signal resulting at that injected node $N_1$ would be in-phase with the periodic injection signal. The injection locked versions of the oscillator signal at the other nodes would be accordingly referenced in phase to node $N_1$. For example, the injection locked oscillator signal version subsequently established at node $N_3$ would be offset in phase from node $N_1$ by two stage-to-stage phase shifts, or 90°. In other words, the I and Q signal references for the periodic injection signal are provided directly at these respective nodes $N_1$ and $N_3$ (assuming substantial similarity in amplitude between the periodic injection and oscillator signals, such as in digital applications generally). Likewise, the $\bar{I}$ and $\bar{Q}$ signal references are provided directly in this case at respective nodes $N_5$ (denoted $N_{n+1}$ in the generalized case illustrated in FIG. 2A) and $N_7$ (denoted $N_{n+3}$ in FIG. 2A). The I, Q, $\bar{I}$, $\bar{Q}$ signal references are all made available essentially in one simple step, by injecting the periodic injection signal at node $N_1$.

Phase interpolated versions of the injection locked oscillator signal may then be recovered at any one of the intervening nodes between these established signal references. Where finer resolution of phase interpolation is required, suitable measures may be employed to establish additional points of signal recovery between consecutive ones of the nodes $N_1$-$N_8$ in the four-stage example. More generally, the nodes $N_1$-$N_{2n}$ may be collectively re-aligned with the discrete phase positions within one signal cycle by either actuating the signal injection portion 5b as before (in its single injection mode), to apply the periodic injection signal still exclusively at one of the nodes, but at a different node from before. In the four-stage example, for instance, the periodic injection signal may be applied at node $N_3$ rather than node $N_1$ of the ring oscillator portion 5a. The I, Q, $\bar{I}$, and $\bar{Q}$ signal references would then be established respectively at nodes $N_3$, $N_5$, $N_7$, and $N_1$.

Alternatively, the signal injection portion 5b may be actuated in a split injection mode, whereby signal injection is carried out simultaneously at multiple nodes of the ring oscillator portion 5a. Preferably, signal injection portion 5b would then split the periodic injection signal in amplitude between a selected pair of nodes $N_1$-$N_{2n}$. The resulting injection signal portions are then simultaneously applied at the selected nodes according to a certain comparative ratio of signal amplitudes (which is preferably set in selective manner). If the comparative ratio is set to a non-zero value, the I signal reference is not aligned with either of the injected nodes. Instead, the I reference is proportionally offset in phase position between the injected nodes, in a manner consistent with the ratio.

Turning again to the four delay stage example, if the comparative injection ratio were set at 50:50, and the split injection signals were simultaneously applied at nodes $N_1$ and $N_2$, for instance, the virtual phase position of the I reference established by the injection locked oscillator signal would be halfway between nodes $N_1$ and $N_2$. As a result, node $N_1$ would be aligned with that virtual phase position minus 22.5° (or at 337.5°), while node $N_2$ would be aligned with that virtual phase position plus 22.5° (or simply at 22.5°) within the injection locked signal cycle, since the phase shift between these consecutive nodes $N_1$ and $N_2$ remains 45°. Alternatively, a 40:60 comparative ratio between the current amplitudes of the split injection signals applied at nodes $N_1$ and $N_2$ would define the resulting I reference at a virtual intermediate position 27° (or 60% of the 45° phase difference) away from the more lightly weighted injection point $N_1$ and 18° (or 40% of the 45° phase difference) away from the more heavily weighted injection point $N_2$. The effect of this would be to align node $N_1$ with the virtual I reference phase position minus 27° (or with 333°), and node $N_2$ with the virtual I reference phase position plus 18° (or simply with 18°) within the injection locked signal cycle.

By selectively adjusting the proportional injection signal split between two nodes, each of the nodes in the ring oscillator portion 5a may be aligned with any interpolated phase within the given injection locked oscillator signal cycle. The desired phase interpolated signal may then be picked off at any one of the prevailing nodes in the ring oscillator portion 5a. Splitting the injection signal between two other nodes has the effect of further shifting the nodes' alignment with the phase positions within the injection locked oscillator signal cycle.

Depending on the particular configuration of components and particular operating conditions of the intended application, there may be other implications of the choice of injection node(s). For example, more signal distortion may be encountered by injecting in one node as opposed to another. In most applications, however, such effects will tend to be negligible, all other factors being equal.

In the examples described in preceding paragraphs, split injection was carried out on consecutive nodes of the ring oscillator portion 5a. In other applications, the split injection may be carried out at nonconsecutive nodes. The split injection effect is preserved as described, unless the injection points are complementary, or 180° apart. Otherwise, the I reference is defined at a virtual point relatively offset between the injection points by a proportional amount of the total phase gap between the two points, consistent with the comparative proportional ratio of the split injection signal amplitudes.

Figures 1, 3:
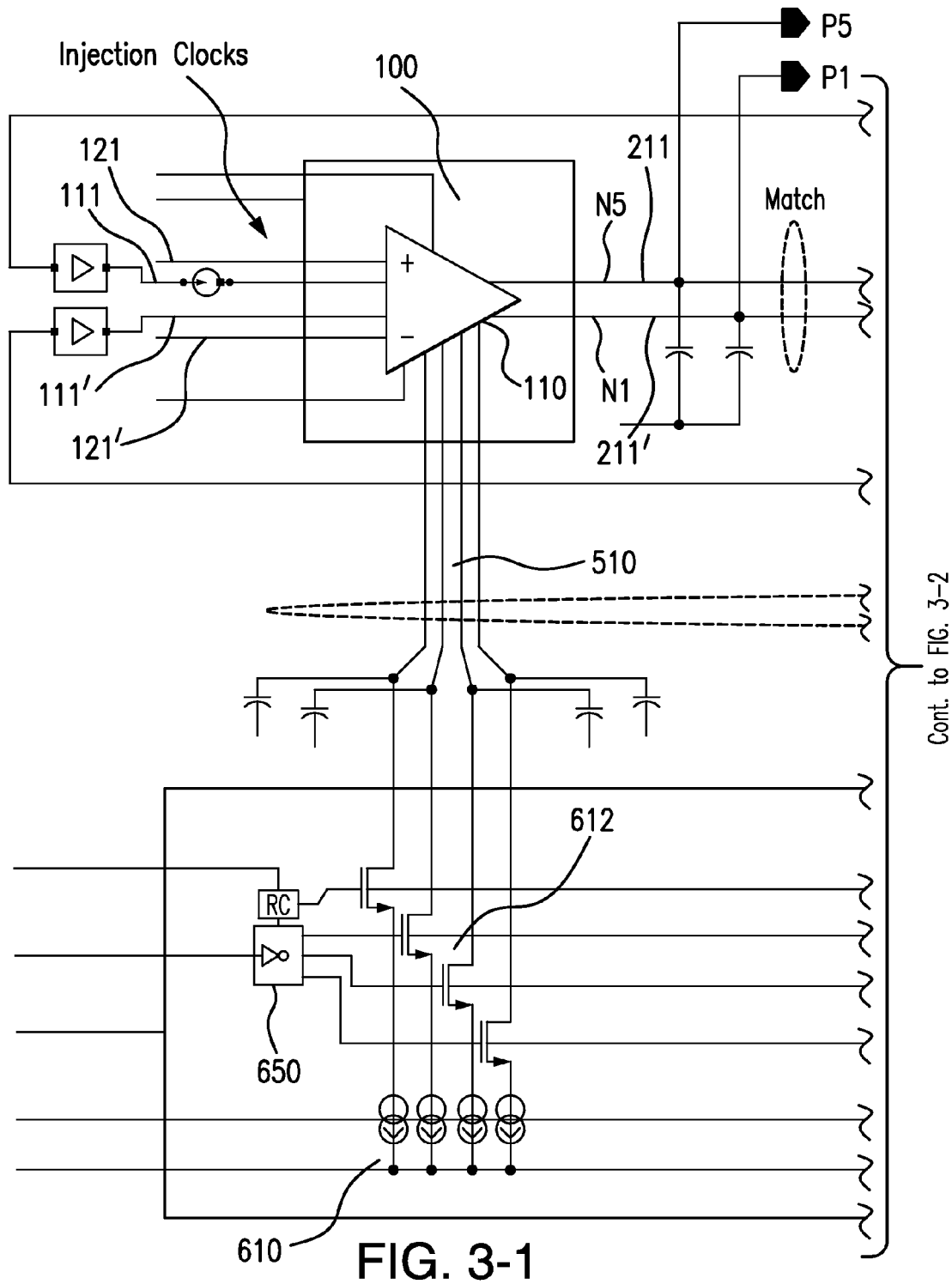
Figures 2, 3:
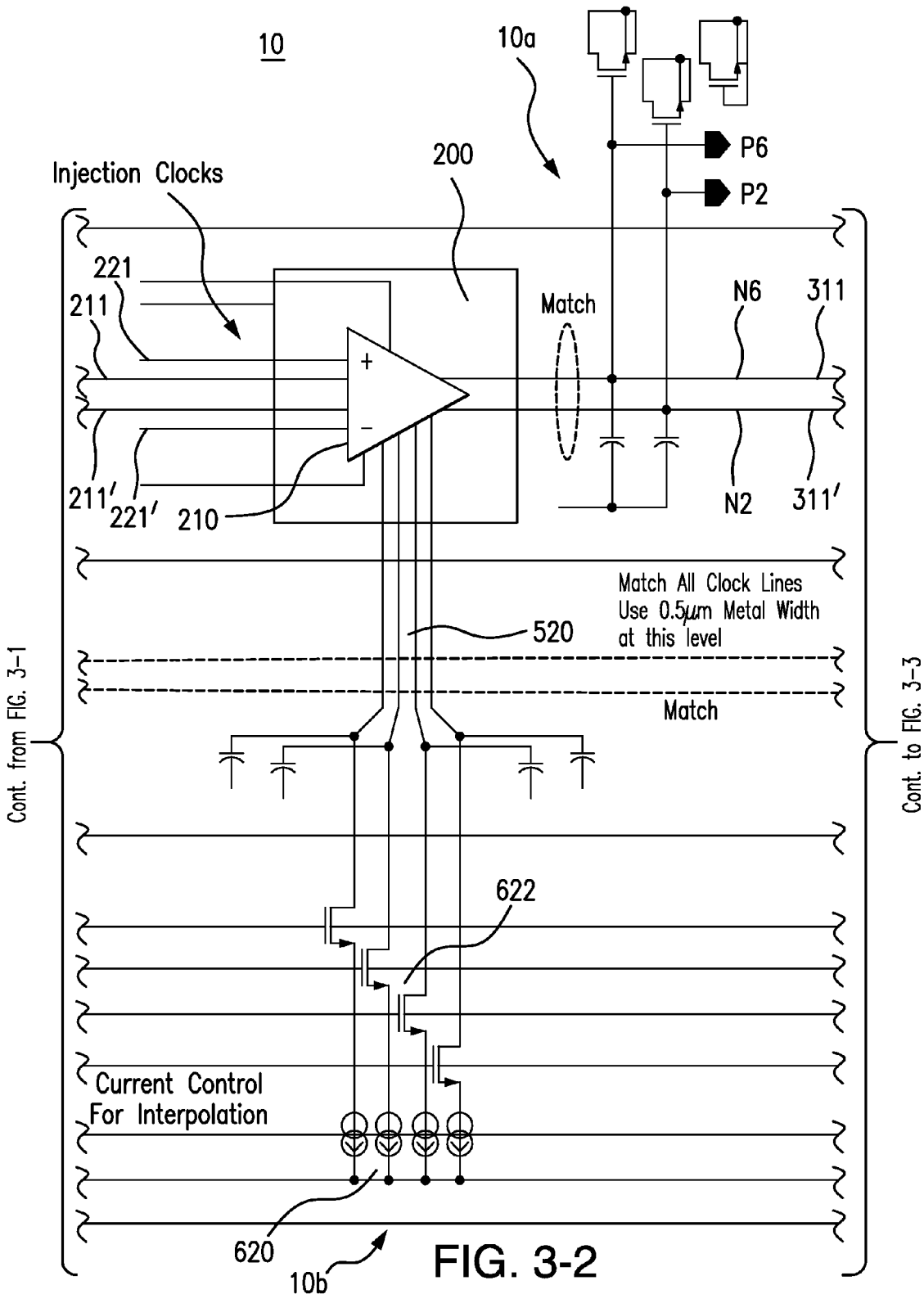
Figure 3:
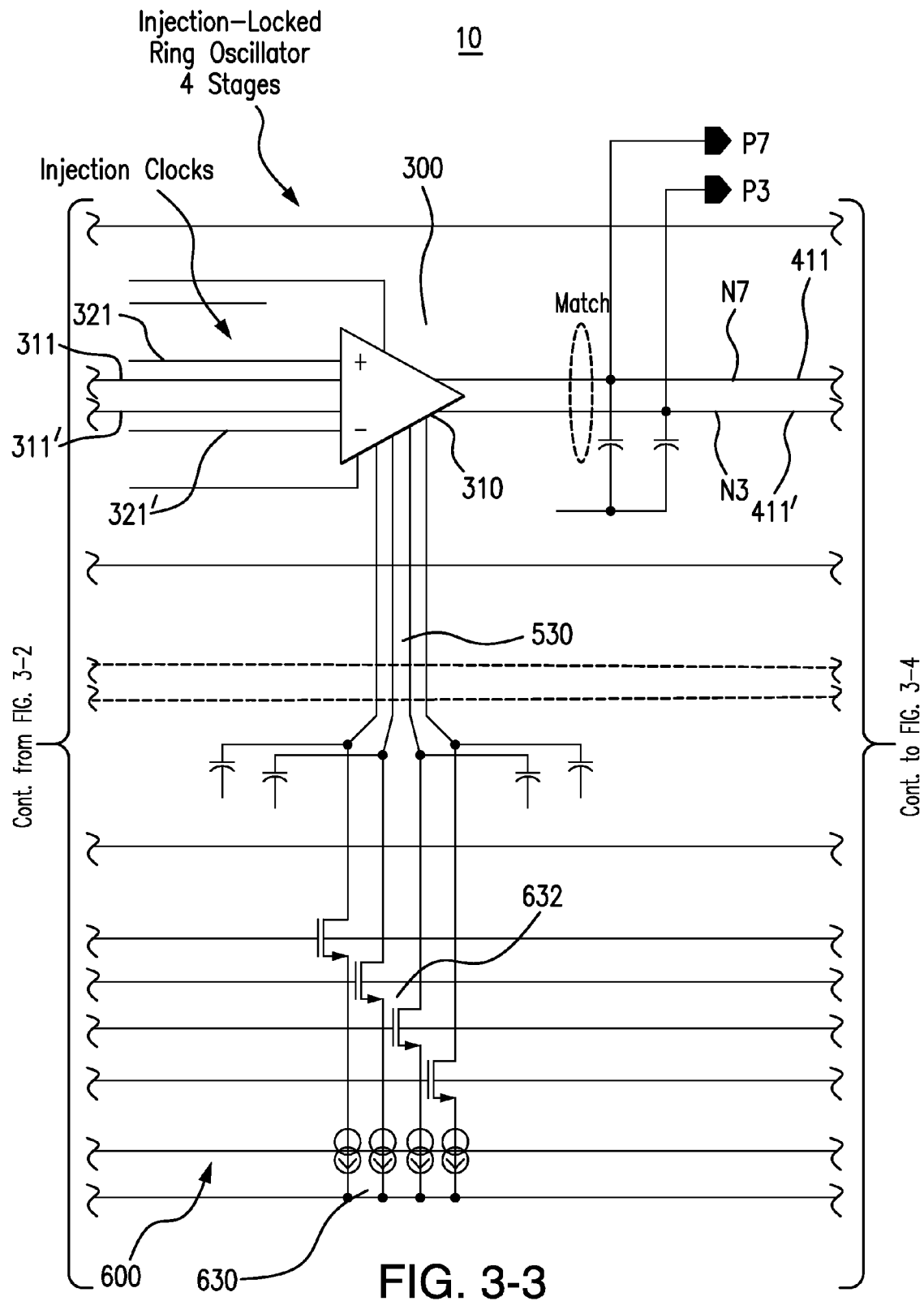
Figures 3, 4:
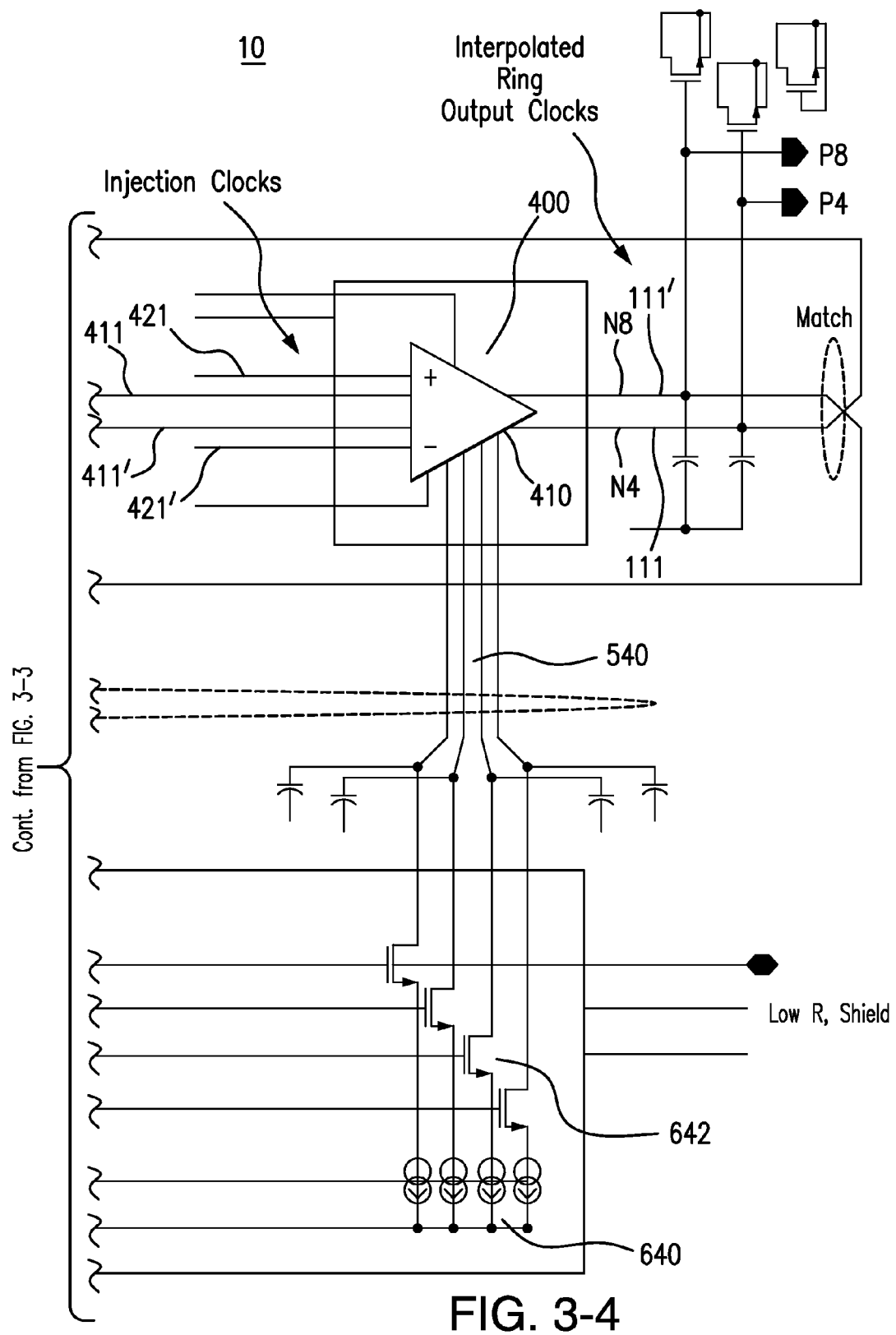
Figure 4A:
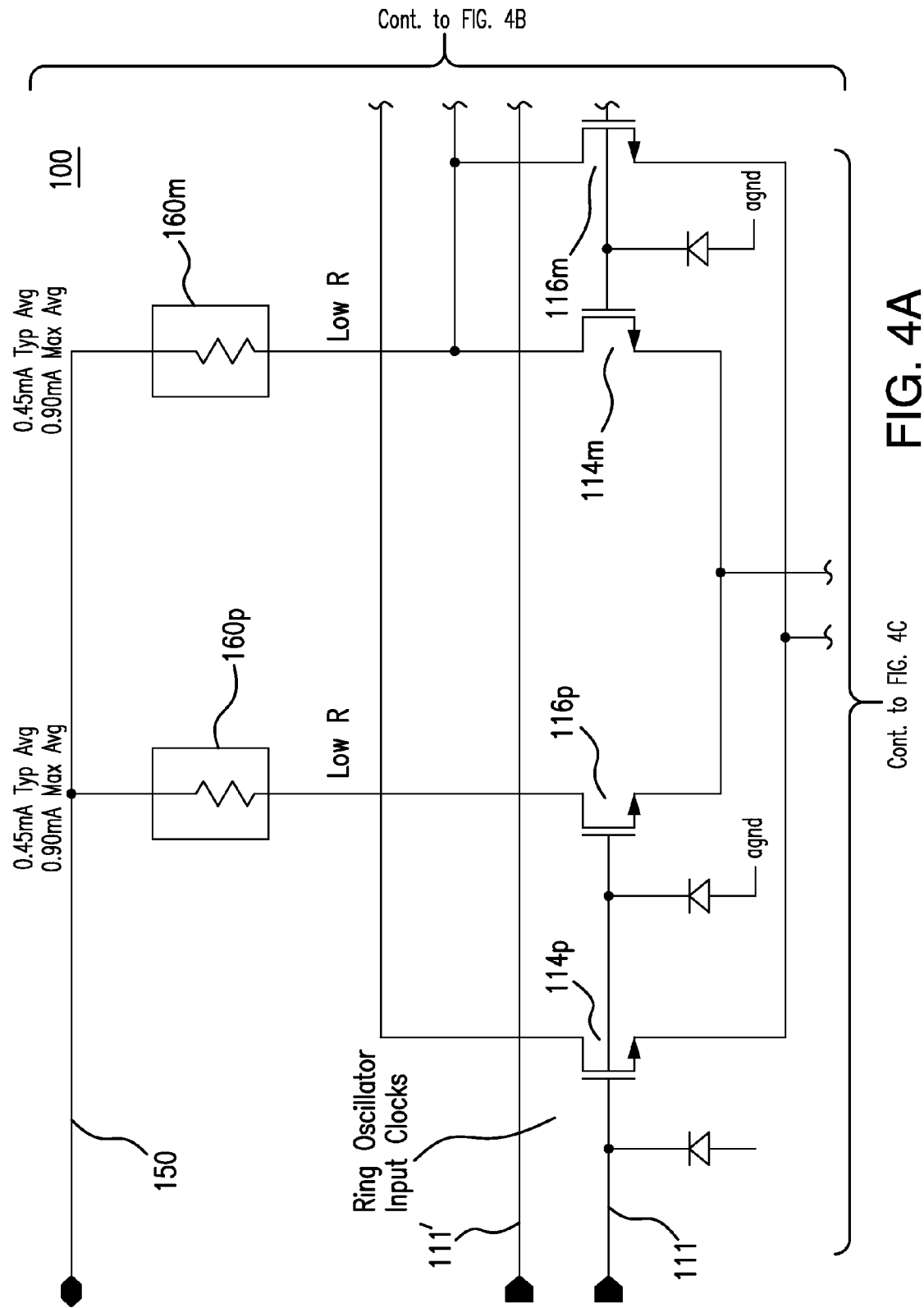
FIGS. 4A to 4D, collectively referred to herein as "FIG. 4," together show a simplified schematic diagram illustrating in greater detail a part of the system embodiment shown in FIG. 3; and, FIG. 5 is a simplified schematic diagram illustrating in isolation an alternate embodiment of another part of the system embodiment shown in FIG. 3.
Figure 4B:
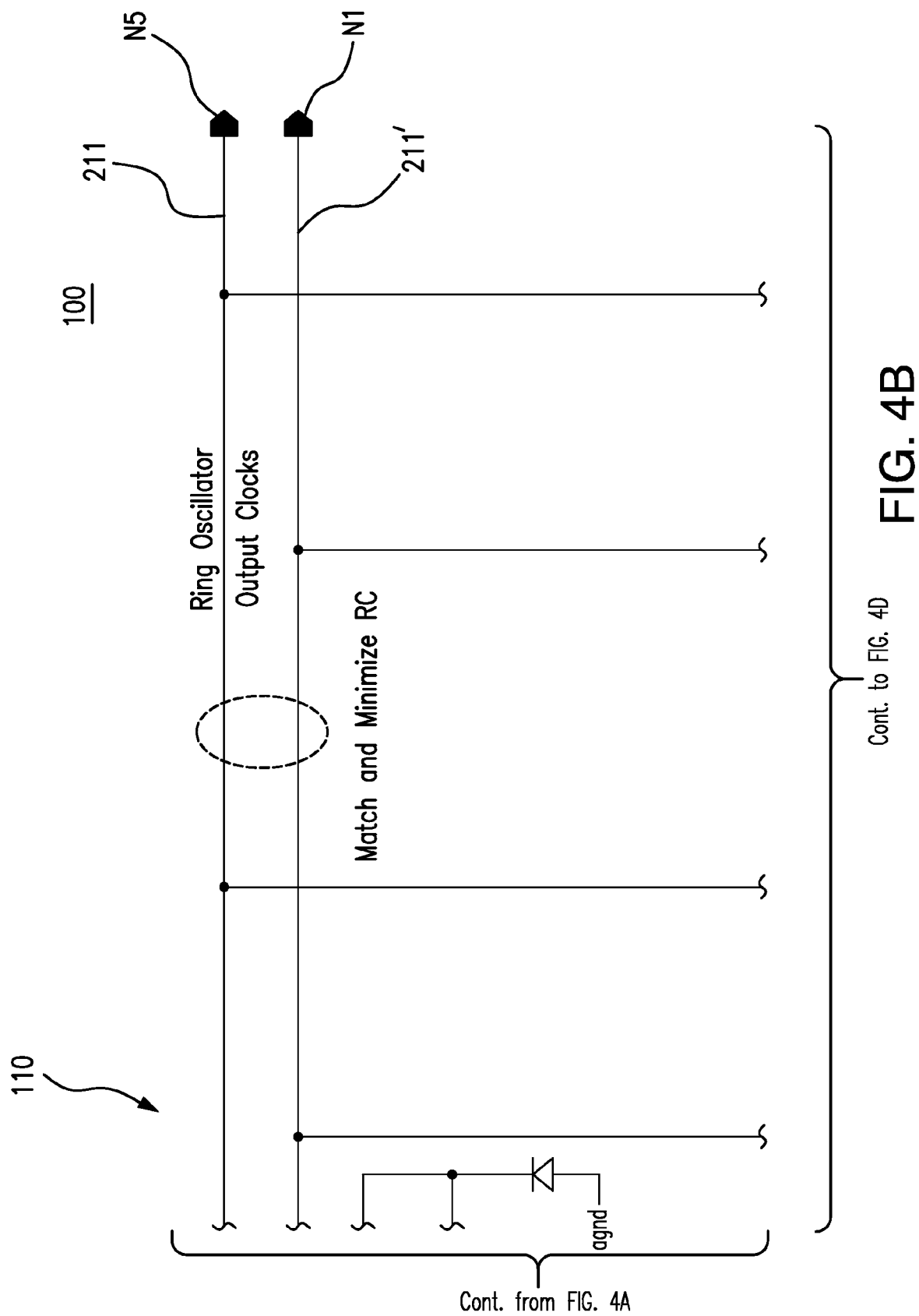
Figure 4C:
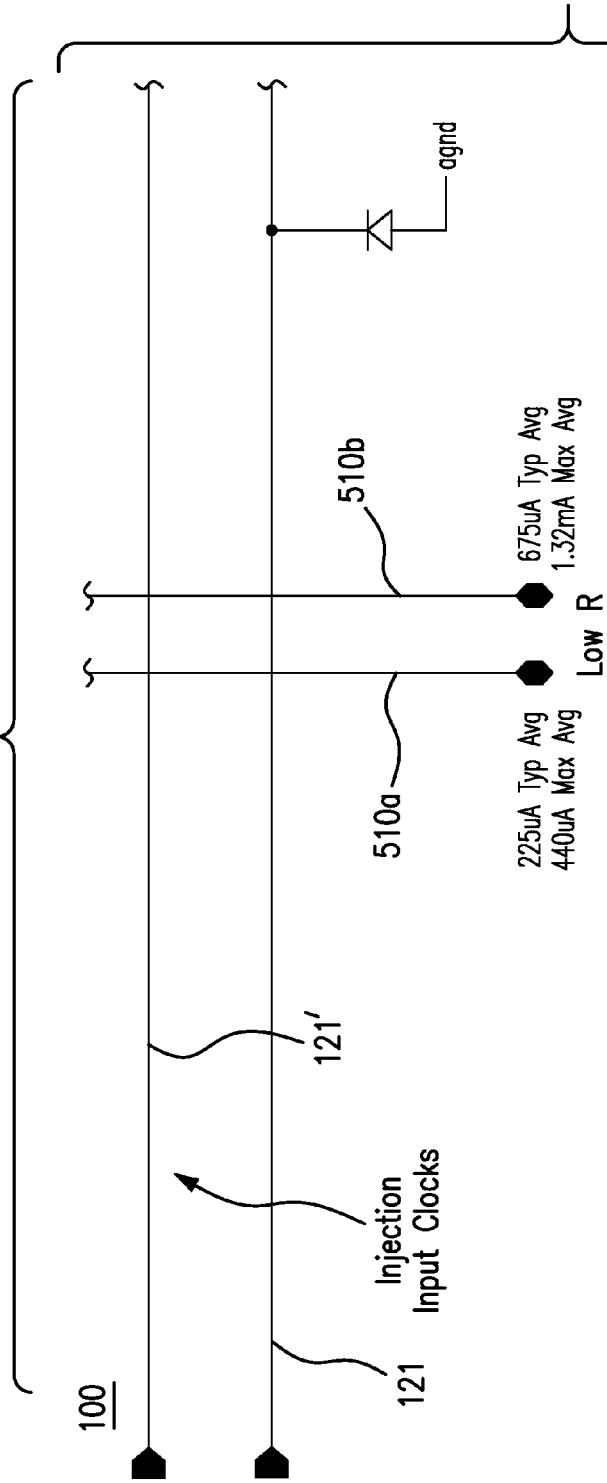
Figure 4C:
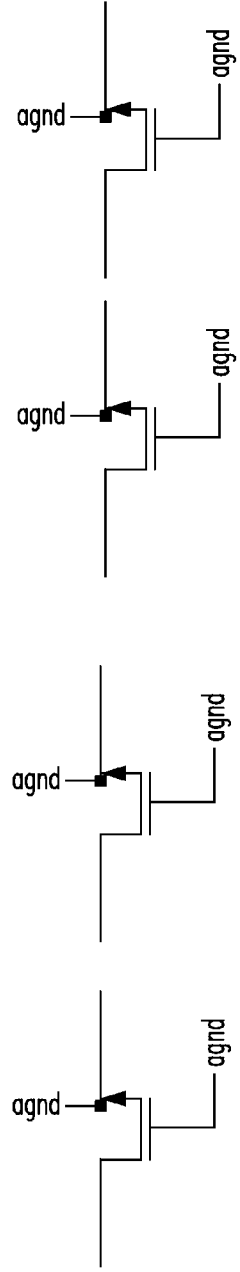
Figure 4D:
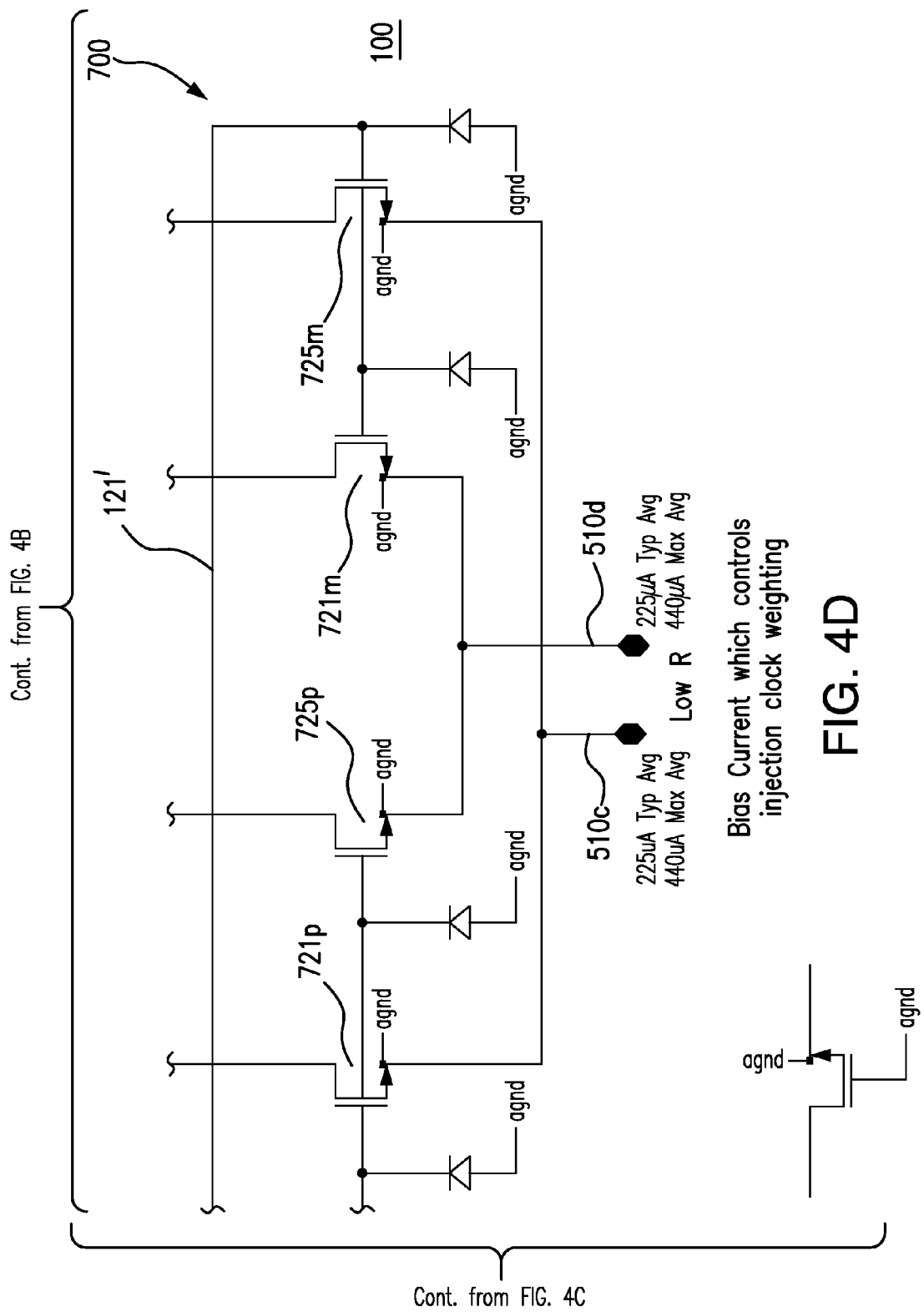

Referring now to FIGS. 3-1 to 3-4 (collectively referred to herein as "FIG. 3"), one example of a system 10 employing a four-stage ring oscillator portion is schematically illustrated. System 10 includes a ring oscillator portion 10a and a signal injection portion 10b coupled thereto. The ring oscillator portion 10a includes four delay stages 100, 200, 300, 400 sequentially interconnected, with the output of the fourth delay stage 400 flipped for feedback to the first delay stage 100. System 10 is configured in this embodiment for operation with differential signals, and each of the delay stages 100-400 includes a differential inverter circuit 110, 210, 310, 410. Since an odd number of inverting stages is necessary for ring oscillation, flipping the output lines of the inverter circuit 410 in the fourth delay stage 400 serves to 'undo' what would otherwise amount to an even, fourth stage of inversion. For brevity and clarity, supply power and other such peripheral interconnections employed for operational implementation of inverter circuits 110-410 are not shown in the simplified diagram of FIGS. 4A to 4D (collectively referred to herein as "FIG. 4").

Each of the delay stages 100-400 is interconnected to receive as its complementary inputs the appropriate pair of outputs from the immediately preceding stage. Each delay stage 100-400 preferably also receives a periodic input signal in the form of complementary injection clocks, as well as a set of current signals provided by the signal injection portion 10b. Once the ring oscillator portion 10a is energized to oscillate, the oscillator signal is established as a complementary pair of oscillator clock components. These oscillator clock components are received at the plus and minus input lines 111, 111' of the first delay stage 100, which lines constitute the plus and minus output lines of the fourth delay stage 400 fed back after flipping/crossing to undo the fourth stage of inversion there. The first stage 100 also receives at plus and minus input lines 121, 121' complementary injection clock signals preferably within a predetermined range (such as within an approximate 15% window) about the prevailing oscillator clock frequency, subject to calibration of the ring oscillator portion.

The first delay stage 100 further receives through certain of the lines 510 one or more current bias signals selectively set in amplitude by controlling measures employed within the signal injection portion 10b. To the extent the current bias signals received through lines 510 are sufficiently set to some nonzero amplitude by the signal injection portion 10b, they are applied to corresponding nodes of portion 10a in accordance with the injection clock signal. In this way, the current bias signal(s) serves to 'weight' (and thereby control in strength) the injection clock signals applied for this first inverter stage 100. The oscillator clock signal components received at the input lines 111, 111' of the circuit 110 are inverted and accordingly delayed (due to the finite gate delay of circuit 110) when they are output to the complementary nodes $N_1$ and $N_5$. The oscillator clock signal versions then provided on nodes $N_1$ and $N_5$ through the plus and minus outputs of the first stage inverter circuit 110 are passed respectively to the minus and plus input lines 211', 211 of the next delay stage 200.

Depending on the weighted strength of the injection clock signal for Nodes $N_1$ and $N_5$, one of the nodes may serve as a primary injection point of injection (as opposed to complementary point of injection provided by the other of the nodes, for out of phase injection). If injection occurred at node $N_1$, for example, the oscillator clock signal is not only injection locked in frequency with the injection clock signal, it is phase locked to that injection clock signal either at the injected node $N_1$ or at a virtual point offset therefrom by a certain phase angle. That is, the version of the injection locked oscillator clock appearing at node $N_1$ in that case is either aligned in-phase with the injection clock signal or otherwise out of phase by the certain phase angle.

Like the first delay stage 100, the second delay stage 200 also receives the complementary injection clock signals at input lines 221, 221', while receiving the oscillator clock signals at plus and minus input lines 211, 211'. Delay stage 200 further receives through one or more lines 520 selectively set bias current signals generated by the signal injection portion 10b for weighting the injection clock signals entered for the stage through lines 221, 221'. Again, the weighted strength of the injection clock signal for the nodes N2 and N6 of this stage determines which if any of these nodes serves as an injection point. If so, the injection locked oscillator clock signal versions then established at the injected node is not only injection locked in frequency to the injection clock signals, it is either aligned in-phase with the injection clock signal there or otherwise out of phase therefrom by a certain phase angle (depending on whether single injection or split injection is effected).

The remaining delay stages 300 and 400 are likewise preferably configured to receive the ring oscillator clock signals from the immediately preceding stage through their complementary input lines 311 and 311', 411 and 411', while separately also receiving the complementary injection clock signals through input lines 321 and 321', 421 and 421'. Each of the delay stages 300, 400 also receives its own set of selectively controlled current signals through lines 530, 540 for selective weighting of the injection clock signals for the stage. The complementary nodes N3 and N7, N4 and N8, at the outputs of these stages 300, 400 provide other possible injection points for injection locking and phase-aligning the oscillator clock signal to the injection clock signal there (or with reference thereto).

As mentioned, the signal injection portion 10b provides a plurality of current signals to, among other things, weight the influence of the injection clock signals upon the oscillator clock signals appearing at the nodes N1-N8 disposed between the delay stages 100-400 of the ring oscillator portion 10a. In this embodiment, the signal injection portion 10b is configured to do so by applying one or more current bias signals to each of the nodes N1-N8 in a manner modulated by the injection clock signals provided at each of the stages. By separately varying the level of current bias applied in this manner to each of the nodes N1-N8, the signal injection portion 10b selectively controls the location, amplitude, and perhaps even the manner (single or split) of thereby injecting a 'periodic injection signal' into the ring oscillator portion nodes N1-N8. In this example, the periodic injection signal is formed as a combined result of the selected current bias signal(s) and the injection clock signal which clocks its application onto the selected node(s) N1-N8.

The signal injection portion 10b preferably includes a current bias section 600 which selectively sets the current bias levels to be applied to the different delay stages 100-400. The signal injection portion 10b also includes an injection clock section represented for simplicity in FIG. 3 within the delay stages 100-400 and not separately denoted. The injection clock section is coupled to the current bias section 600, and operates responsive to the injection clock signals provided for the various delay stages to switch the application of the provided current bias signals onto the selected ones of the nodes N1-N8.

The current bias section 600 preferably includes sets of variable current sources 610, 620, 630, 640 coupled to the respective delay stages 100-400 through corresponding sets of switching devices 612, 622, 632, 642. These switching devices 612, 622, 632, 642 are suitably controlled by a control unit 650. While not specifically shown in the simplified schematic view of FIG. 3, control unit 650 may be realized by any suitable means known in the art to separately adjust the current biasing levels delivered to the nodes of each delay stage 100-400, through the biasing lines 510, 520, 530, 540. Preferably, control unit 650 is programmably actuated toward that end. While the current bias section 600 is illustratively shown with a particular number of current sources 610, 620, 630, 640 and switching devices 612, 622, 632, 642, any suitable number and configuration of such devices may be employed depending on the particular requirements of the intended application. Regardless of how actually implemented, current bias section 600 preferably provides the current bias levels for application to the different nodes N1-N8 in separately variable manner.

FIG. 4 illustrates in greater representative detail certain portions of the first delay stage 100 shown in FIG. 3. While the other delay stages 200, 300, 400 are not separately shown, they are each preferably formed in the disclosed system embodiment with substantially like structure. Also shown with the first delay stage 100 in FIG. 4 are parts of the signal injection portion 10b interconnected to this stage—namely, the part of a current bias section 700 serving the stage.

Given the differential signal configuration of the present embodiment, delay stage 100 includes a differential inverter circuit 110 coupled to a high supply rail voltage source 150 through resistive elements 160p, 160m, and to a low supply rail (not shown) via the lines 510a, 510b. Inverter 110 may be formed with any configuration known in the art suitable for the requirements of the intended application. In this embodiment, the inverter circuit 110 is formed with a pair of re-channel MOSFET (metal-on-silicon field effect transistor) devices 114p, 116p whose gate terminals are commonly tied to the input line 111 for the plus component of the oscillator clock, as well as n-channel MOSFET devices 114m, 116m whose gate terminals are tied conversely to the input line 111' for the complementary minus component of the oscillator clock. The drain terminals of these MOSFET devices 114p, 116p, 114m, 116m are each tied through the resistance elements 160p, 160m to the supply voltage 150. The drain terminals of the devices 114p, 116p, are tied also to the inverted output line 211 (which, except in the case of the fourth stage inverter 410 serves as the plus input to the next stage inverter), while the drain terminals of the devices 114m, 116m are tied also to the non-inverted output line 211' (which with the exception of the fourth stage inverter 410 serves as the minus input line for the next stage inverter). The source terminals of the devices 114p, 116p are tied to line 510a, while the source terminals of the other devices 114m, 116m are tied to line 510b. Predetermined direct current signals, as set by the current bias section 600, are applied through these lines 510a, 510b (see FIG. 3).

As one of ordinary skill in the art will readily recognize, inverter 110 serves to generate on output lines 211 and 211' state-inverted versions of the oscillator clock signal components received on input lines 111 and 111'. When the oscillator clock signal component on input line 111 is high, both of the NMOSFET devices 114p, 116p preferably switch on (depending on their gate-source voltages established as a result of connections through lines 510a, 510b). In the meantime, the complementary oscillator clock signal component on line 111' keeps the NMOSFET devices 114m, 116m in their off, or nonconductive, state. Output line 211 tied to the drains of the devices 114p, 116p is thereby pulled down to a low level in voltage by the conducting devices. The complementary output line 211' remains—along with the drain terminals of the devices 114m, 116m—substantially at the high level voltage of supply rail 150.

Conversely, when the input oscillator clock signal component on line 111 is low, such that its complementary component on line 111' is high, the situation reverses. The devices 114m, 116m are preferably configured to both switch on (depending on their gate-source voltages established as a result of the input clock component and connections through lines 510a, 510b), while the other devices 114p, 116p are forced to their nonconductive off states. The output line 211' is then pulled to the low level voltage, while line 211 assumes the high level voltage of supply rail 150.

As described in preceding paragraphs, the inverter circuit 110 cannot respond instantaneously during operation, as real devices take time to charge, discharge, switch, and the like. The inverter circuit 110 thus entails some finite gate delay time, which affects the characteristic frequency of the oscillator clock signal established in the ring oscillator portion 10a, and imposes a corresponding phase shift in the inverted signal. The inverted version of the oscillator clock signal components thus established on the output lines 211, 211', or at nodes N5, N1 of this stage, are phase shifted by a predetermined phase angle, compared to the corresponding oscillator clock versions appearing at the input lines 111, 111' of the stage.

As also described in preceding paragraphs, in order to injection lock the oscillator clock signal to a periodic injection signal, the oscillator clock signal must be sufficiently close in frequency to the injection signal. Ring oscillators, however, tend to be quite susceptible to variations in operating conditions, normally making it difficult to establish oscillator signals with much consistency in characteristic frequency. Factors such as thermal drift, for instance, may cause the ring oscillator portion 10*a* of system 10 to initially establish an oscillator clock whose frequency is outside the required range for reliable injection lock according to the given injection clock signals.

Accordingly, a suitable process is preferably carried out when the ring oscillator portion 10*a* is initially started up to calibrate its frequency. Any suitable process known in the art may be employed in this regard. One suitable technique is to couple the ring oscillator portion 10*a* to a counter which counts the resulting oscillator signal cycles, and compare the count to a similar count performed on a preselected reference signal. Depending on the comparison of counts, various parameters of the delay stages 100-400 may be adjusted to calibrate the ring oscillator portion 10*a*. These adjustments may be effected, for example, by suitably varying certain capacitance, resistance, current, or other such parameters in one or more of the delay stages 100-400. Toward that end, the resistance elements 160*p*, 160*m* shown in the inverter circuit 110 of FIG. 4 are preferably implemented as variable resistance elements. Likewise, the current signals provided on the pull down side of the inverter circuit 110 through lines 510*a*, 510*b* may be varied as necessary. Other such adjustment measures may be similarly incorporated into each of the delay stages 100-400.

Turning to the signal injection measures for each stage, the injection clock section 700 for this stage generally includes switching devices controlled by the given injection clock signal components to selectively apply the current bias signals appropriately set and provided by the variable current bias section 600 of the signal injection portion 10*b*. For the first delay stage 100 shown, the injection clock section 700 serves both of the nodes N1 and N5 associated with the stage. The current bias signals for these nodes N1 and N5 are each variably provided by the current bias section 600 through respective lines 510*c* and 510*d*. In the case of a current bias signal generated for node N1, the signal is directed by line 510*c* to the conduction path switched by the switching device 721*p*, whose control terminal is tied to the plus injection clock input line 121. In this particular embodiment, when the injection clock signal component from this line 121 is high, the switching device 721*p* is switched on to conduct, and the current bias level provided at line 510*c* is applied to node N1 via line 211'. For the purposes of symmetry in this differential embodiment, the same current bias signal is preferably also applied through a complementary path from line 510*c* through the conduction path of switching device 725*m* to the complementary node N5 (via line 211), when the complementary injection clock signal component 121' (tied to the control terminal of switching device 725*m*) goes high. Since the input injection clock signal components on lines 121 and 121' are mutually 180° out of phase, the current bias signal entering through line 510*c* is not simultaneously applied to the complementary nodes N1 and N5. Instead, the current bias signal is applied 180° out of phase to these complementary nodes N1 and N5.

A current bias signal generated to set a primary injection point at node N5 is similarly directed by line 510*d* concurrently to the complementarily switched devices 725*p* and 721*m*. When the injection clock component on input line 121 goes high, the switching device 725*p* switches on, such that whatever current bias signal is provided by current bias section 600 at line 510*d* is applied through the conduction path of device 725*p* to node N5 via line 211. During that time, since the complementary injection clock component on line 121' is necessarily low, device 721*m* remains switched off. When the injection signal clock component on line 121 goes low, however, the complementary injection clock component on line 121' goes high, switching the device 721*m* on. The current bias signal entering through line 510*d* is then passed through the conduction path of device 721*m* to the complementary node N1 via line 121'.

During normal operation, current bias section 600 operates to variably set the current bias signal available on each of the lines 510*c* and 510*d*. Equal current bias levels are normally not provided simultaneously on these two lines 510*c*, 510*d*, so that constant biasing of the nodes N1 and N5 is avoided.

In any event, a current bias provided on either of the lines 510*c*, 510*d* is periodically applied according to the states of the input injection clock signal components on the complementary lines 121, 121'. A periodic injection signal is thereby formed and injected into the given node for injection lock coupling with the ring oscillator clock signal thereat. In doing so, the amplitude of current bias determines the weight of the periodic injection signal (the injection clock signal component applied in this embodiment). In the absence of any other simultaneous signal injection at another of the nodes N2-N4, N6-N8 (single injection mode), the I signal reference of the periodic injection signal is established in-phase at the currently injected node N1 or N5. Otherwise, depending on the proportional weight of the given injection signal relative to another injection signal applied in similar manner simultaneously at another of the nodes N2-N4, N6-N8, the I signal reference for the injection clock signal is established at a virtual node proportionally offset from the currently injected node (N1 or N5) towards the other simultaneously injected node. The Q signal reference will simply be positioned in phase angle 90° from the I reference node, regardless of whether it is established at a physical or a virtual node.

This ability to selectively re-position the I reference at or with respect to a particular node N1-N8 of the ring oscillator portion 10*a* makes it possible to conveniently situate the I, Q, $\bar{\text{I}}$, $\bar{\text{Q}}$ reference signals at any set of the nodes N1-N8. Once the ring oscillator has sufficiently run, the delayed versions of the injection locked ring oscillator clock signal established at those nodes will constitute the I, Q, $\bar{\text{I}}$, and $\bar{\text{Q}}$ reference signals. The reference signals may then be accessed directly by coupling to their respective nodes.

If a certain phase-interpolated signal (based on the I and Q references of the input injection clock signal) is sought at one of the nodes N1-N8, injection lock may be effected by appropriately weighting the injection signal at a select pair of the nodes N1-N8. Although the I and Q references may be positioned at virtual rather than real nodes (between rather than at any of the physical nodes N1-N8), the phase interpolated signal desired may be conveniently accessible at a physical node. The alignment between the nodes N1-N8 and the range of phase positions within a signal cycle may be adjusted as desired by appropriately weighting the split injection at selected nodes. In this way, the phase position reference may be 'revolved' around the ring oscillator portion nodes N1-N8.

In certain alternate embodiments, the number of physical nodes available for direct access to generated I, Q, $\bar{\text{I}}$, $\bar{\text{Q}}$ reference signals and to various phase interpolated signals may be increased by increasing the number of delay stages of the ring oscillator portion 10*a*. There are prohibitive limits, however, to the number of delay stages which may be employed in practice. Alternatively, additional intermediate nodes may be physically implemented by other means to the extent permitted by the particular requirements of the intended application. For example, resistive voltage divider networks may be incorporated between certain of the nodes N1-N8 with parametric values appropriately set to formulate additional physically accessible points of phase offset relative to the existing nodes.

Figure 5:
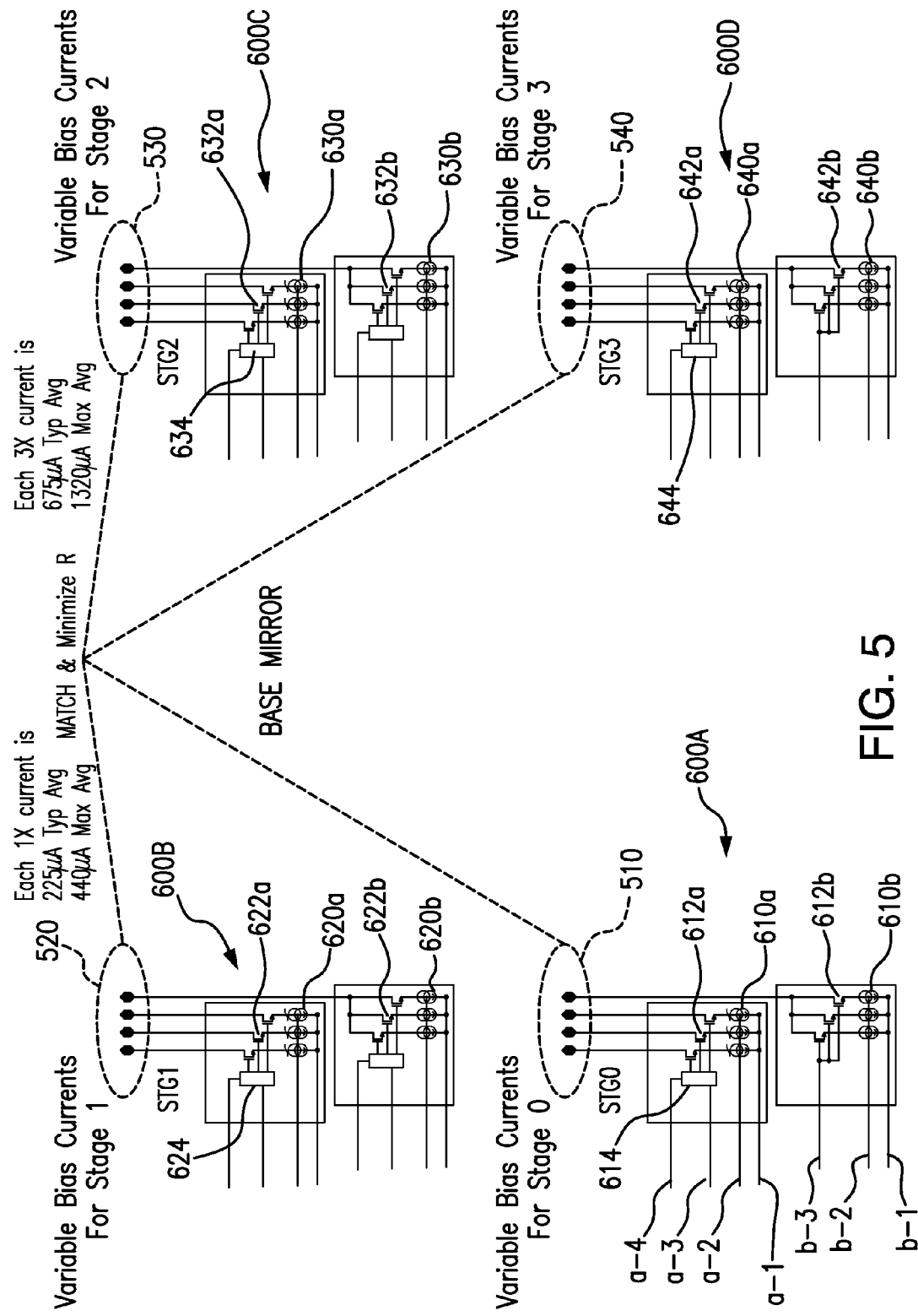

Any suitable measures known in the art may be employed to variably control the bias current levels applied at any given time for each of the nodes N1-N8. In the example illustrated in FIG. 5, current bias section 600' includes a plurality of current biasing stages 600A-600D, one for each of the four delay stages 100-400. In this example, each current biasing stage 600A-600D includes a plurality of switching devices 612a, 612b, 622a, 622b, 632a, 632b, 642a, 642b which are programmably controlled to selectively pass a plurality of bias current levels generated by variable current sources 610a, 610b, 620a, 620b, 630a, 630b, 640a, 640b for each stage, for application through the lines 510, 520, 530, 540. In this example, four current signals are variably generated for each set of lines 510, 520, 530, 540 serving the respective delay stages 100-400. Two of the variable current signals in each stage are preferably set for the inverter circuit 110, 210, 310, 410 of that stage, while the other two variable current signals in each stage are preferably set for signal injection purposes at the complementary nodes associated with the stage.

The current signals serving a given inverter circuit need not be variable. Their variability, however, provides certain advantages in practice. For example, they may be adjusted to maintain voltage amplitude stability upon current bias signal injection, to help calibrate the ring oscillator portion, and to serve other such purposes.

The current biasing stages 600A-600D are preferably formed with substantially the same configuration, and the first current biasing stage 600A is representatively described in greater detail herein. As illustrated, the first stage 600A (like the other stages) includes a base mirror portion formed by a plurality of switching devices 612b and variable current sources 610b, which makes a certain base current signal available for application to the corresponding delay stage 100. The control terminals of this portion's switching devices 612b are commonly tied to a power source voltage b-3 to remain in their conductive states. The variable current sources 610b are each implemented as current mirrors coupled between the switching devices and ground b-1. Each current mirror's current level is set according to a certain bias voltage b-2.

The first stage 600A also provides other variable current signals through a decoded mirror portion formed by a plurality of switching devices 612a and variable current sources 610a, which makes a plurality of other individually controllable current signals available for application to the delay stage 100. The control terminals of this portion's switching devices 612a are each tied to and individually driven by a decoder 614 (marked 624, 634, 644 in the other current biasing stages), for selectively switching current sources 610a to respective lines 510. Each of the variable current sources 610a is itself preferably implemented as a set of selectively grouped current mirrors.

While each variable current source 610a is symbolically represented as one current source, it is actually formed in the disclosed embodiment as a gang of current mirrors coupled in parallel to collectively form one variable current source 610a. In this example, eight such current mirrors may be selectively coupled in parallel to collectively drive the current bias injection through each of the current bias lines 510c and 510d for delay stage 100 (see FIG. 4). The injection weight for each node N1, N5 of the ring oscillator portion 10a may then me incrementally set to one of eight weighting values. Each of the individual current mirrors (in one current source 610a) would be connected to ground a-1 and set by a bias voltage a-2 to provide substantially the same current value. Though the connections are not shown, each individual current mirror would also enabled by a corresponding switch device controlled by the decoder 614), such that any one or more, or even none, of the current mirrors may contribute to the current bias signal effectively provided by current source 610a. The current bias signal may be formed thereby with full weight, no weight, or with an intermediate weight incrementally set therebetween.

The decoder 614 is energized by a power source voltage a-4, and actuated according to a digital control signal a-3. Decoder 614 may be formed in any suitable manner known in the art to provide selective setting and application of the variable current bias signals for the given delay stage, through lines 510.

In alternate embodiments, any suitable number of current sources may be ganged together to provide incremental current bias control. Indeed, altogether different current bias control measures may be employed. Additional measures may be employed as well to individually adjust the bias current signals generated by each current biasing stage 600A-600D, or alternatively to formulate current bias levels by combining certain ones of these current signals.

Although this invention has been described in connection with specific forms and embodiments thereof, it will be appreciated that various modifications other than those discussed above may be resorted to without departing from the spirit or scope of the invention as defined in the appended claims. For example, the device types, channel polarities, sizes, operating or characteristic voltages and currents, fabrication technologies, and the like specifically shown or described may be suitably varied or replaced as necessary for the particular requirements of various applications. Moreover, functionally equivalent elements or processes may be substituted for those specifically shown and described, certain features may be used independently of other features, and in certain cases, particular locations of the elements or processes may be reversed or interposed, all without departing from the spirit or scope of the invention as defined in the appended claims.

What is claimed is:

1. A system for combined generation of In-phase (I) and Quadrature (Q) signal references according to a periodic input signal and selective phase interpolation of an output signal with reference thereto comprising:
    a ring oscillator portion generating an oscillator signal, said ring oscillator portion including a plurality of delay stages interconnected in cascade to collectively execute an odd number of signal state inversions within a closed loop, said delay stages being configured to establish at respective nodes defined therebetween corresponding delayed versions of the oscillator signal successively shifted in phase by a predetermined phase difference; and
    a signal injection portion coupled to said ring oscillator portion selectively applying to at least one said node a current bias according to the periodic input signal, said signal injection portion selectively adjusting each said current bias in amplitude, said signal injection portion thereby locking said oscillator signal in frequency to the periodic input signal and defining said I and Q references thereof with respect to the delayed version of said oscillator signal thereafter established at said current biased node.

2. The system as recited in claim 1, wherein said I reference of the periodic input signal is formed by said delayed oscillator signal version established at said current biased node responsive to said signal injection portion applying said current bias exclusively thereto.

3. The system as recited in claim 1, wherein said I reference of the periodic input signal is offset in phase between said delayed oscillator signal versions established at first and second nodes responsive to said signal injection portion concurrently applying said current bias at first and second current amplitudes respectively thereto, said I reference being thereby offset in phase in comparative relation to a ratio of said first and second current amplitudes.

4. The system as recited in claim 1, wherein the periodic input signal and said oscillator signal are each of differential signal type, and each of said delay stages includes a differential inverting amplifier having complementary outputs coupled to a complementary pair of said nodes, said delayed oscillator signal versions at said complementary node pair being mutually offset in phase by approximately 180°.

5. The system as recited in claim 4, wherein said signal injection portion includes:
 a current bias section including at least one current source selectively actuated to variably generate a plurality of biasing current signals for respective nodes between said delay stages; and,
 an injection clock section coupled to said current bias section, said injection clock section including a plurality of switching devices actuated responsive to the periodic input signal to selectively couple said biasing current signals to corresponding ones of said nodes.

6. The system as recited in claim 5, wherein said signal injection portion is selectively actuated in single and split injection modes;
 said signal injection portion in said single injection mode applying said current bias exclusively to one of said nodes, said delayed oscillator signal version established at said current biased node thereby forming said I reference of the periodic input signal; and,
 said signal injection portion in said split injection mode applying said current bias concurrently to first and second ones of said nodes, said biasing current signal of said first node being applied at a first current amplitude, said biasing current signal of said second node being applied at a second current amplitude, said I reference being offset in phase between said delayed oscillator signal versions established at said first and second nodes in proportional relation to a ratio of said first and second current amplitudes.

7. The system as recited in claim 6, wherein said ring oscillator portion includes four said delay stages with said complementary outputs of said differential inverting amplifier in one delay stage being crossed for input to the next of said delay stages, said delayed oscillator signal versions established at said nodes of said ring oscillator portion thereby defining a plurality of phase interpolated signals successively offset one from the other in phase by said predetermined phase difference of approximately 45°.

8. The system as recited in claim 6, wherein said signal injection portion includes a plurality of said current bias sections each selectively coupled to a corresponding one of said delay stages by said injection clock section, each said current bias section being selectively configured to variably define said biasing current signal in current amplitude.

9. The system as recited in claim 8, wherein said signal injection portion includes one said current bias section for each of said delay stages, each of said current bias sections being programmably controlled.

10. A system for combined generation of In-phase (I) and Quadrature (Q) signal references injection locked to a periodic injection signal and adjustable phase interpolation of an output signal with reference thereto comprising:
 a ring oscillator portion generating an oscillator clock signal, said ring oscillator portion including a plurality of delay stages interconnected in cascade to collectively execute an odd number of signal state inversions within a closed loop, said delay stages being configured to establish at respective nodes defined therebetween corresponding delayed versions of the oscillator clock signal successively shifted in phase by a predetermined phase difference; and
 a signal injection portion coupled to said ring oscillator portion selectively applying the periodic injection signal to at least one of said nodes for locking said oscillator signal thereto in frequency, said signal injection portion selectively varying a current amplitude of the periodic injection signal;
 wherein said signal injection portion is selectively actuated in single and split injection modes;
  said signal injection portion in said single injection mode applying the periodic injection signal exclusively to a selected one of said nodes, said delayed oscillator signal version thereafter established at the selected node thereby forming said I reference; and,
  said signal injection portion in said split injection mode applying said periodic injection signal concurrently to first and second ones of said nodes, said periodic injection signal being applied to said first node at a first current amplitude and to said second node at a second current amplitude, said I reference being offset in phase between said delayed oscillator signal versions established at said first and second nodes in proportional relation to a ratio of said first and second current amplitudes.

11. The system as recited in claim 10, wherein said oscillator signal is of differential signal type, and each of said delay stages includes a differential inverting amplifier having complementary outputs coupled to a complementary pair of said nodes, said delayed oscillator signal versions at said complementary node pair being mutually offset in phase by approximately 180°.

12. The system as recited in claim 11, wherein said signal injection portion includes:
 a current bias section including at least one current source selectively actuated to variably generate a plurality of biasing current signals for respective nodes between said delay stages; and,
 an injection clock section coupled to said current bias section, said injection clock section including a plurality of switching devices actuated responsive to a periodic injection clock signal to selectively couple said biasing current signals to corresponding ones of said nodes.

13. The system as recited in claim 12, wherein said ring oscillator portion includes four said delay stages with said complementary outputs of said differential inverting amplifier in one delay stage being crossed for input to the next of said delay stages, said delayed oscillator signal versions established at said nodes of said ring oscillator portion thereby defining a plurality of phase interpolated signals successively offset one from the other in phase by said predetermined phase difference of approximately 45°.

14. The system as recited in claim 13, wherein said signal injection portion includes a plurality of said current bias sections each selectively coupled to a corresponding one of said delay stages by said injection clock section, each said current bias section being selectively configured to variably define said biasing current signal in current amplitude.

15. The system as recited in claim 14, wherein said signal injection portion includes one said current bias section for each of said delay stages, each of said current bias sections being programmably controlled.

16. A method for generating In-phase (I) and Quadrature (Q) signal references according to a periodic injection signal and selective phase interpolating an output signal with reference thereto comprising:
- establishing a ring oscillator portion to generate an oscillator signal, said ring oscillator portion including a plurality of delay stages interconnected in cascade to collectively execute an odd number of signal state inversions within a closed loop;
- generating at respective nodes defined respectively between consecutive delay stages correspondingly delayed versions of the oscillator signal successively shifted in phase by a predetermined phase difference;
- applying the periodic injection signal selectively to at least one of said nodes for locking said oscillator signal thereto in frequency, the periodic injection signal being selectively varied in current amplitude;
- wherein the periodic injection signal is selectively applied in single or split injection modes to selectively position said I reference of the periodic injection signal with respect to a selected one of said nodes;
  - applying the periodic injection signal in said single injection mode exclusively to the selected one of said nodes, said delayed oscillator signal version established at the selected node thereby forming said I reference; and,
  - applying the periodic injection signal in said split injection mode concurrently to selected first and second ones of said nodes, said periodic injection signal being applied to said first node at a first current amplitude and to said second node at a second current amplitude, said I reference being offset in phase between said delayed oscillator signal versions thereafter established at said first and second nodes in comparative relation to a ratio of said first and second current amplitudes.

17. The method as recited in claim 16, wherein said oscillator signal is of differential signal type, and each of said delay stages includes a differential inverting amplifier having complementary outputs coupled to a complementary pair of said nodes, said delayed oscillator signal versions at said complementary node pair being mutually offset in phase by approximately 180°.

18. The method as recited in claim 17, wherein applying said periodic injection signal includes:
- selectively actuating at least one current source to variably generate a plurality of biasing current signals for respective nodes between said delay stages of said ring oscillator portion; and,
- actuating a plurality of switching devices responsive to a periodic injection clock signal to selectively couple said biasing current signals to corresponding ones of said nodes.

19. The method as recited in claim 18, wherein four said delay stages are established in said ring oscillator portion, said complementary outputs of said differential inverting amplifier in one delay stage being crossed for input to the next of said delay stages, said delayed oscillator signal versions established at said nodes of said ring oscillator portion thereby defining a plurality of phase interpolated signals successively offset one from the other in phase by said predetermined phase difference of approximately 45°.

20. The method as recited in claim 19, wherein a plurality of said biasing current signals are selectively coupled to corresponding ones of said delay stages, and each said biasing current signal being variably defined in current amplitude to selectively position said I reference with respect to said nodes.

21. The method as recited in claim 20, wherein each of said biasing current signals is programmably controlled.

* * * * *